US007393709B2

(12) United States Patent
Watanabe

(10) Patent No.: US 7,393,709 B2
(45) Date of Patent: Jul. 1, 2008

(54) MICROLENS MANUFACTURING METHOD

(75) Inventor: Minoru Watanabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 317 days.

(21) Appl. No.: 11/235,276

(22) Filed: Sep. 27, 2005

(65) Prior Publication Data

US 2006/0105490 A1    May 18, 2006

(30) Foreign Application Priority Data

Nov. 15, 2004    (JP) ............................. 2004-330157

(51) Int. Cl.
*H01L 33/00* (2006.01)
*H01L 31/0232* (2006.01)

(52) U.S. Cl. .................. 438/29; 438/71; 257/E33.068; 257/E31.127

(58) Field of Classification Search .................. 438/27, 438/65, 69, 71, 760; 257/E33.074, E31.127, 257/E21.026
See application file for complete search history.

(56) References Cited

U.S. PATENT DOCUMENTS

| | | | |
|---|---|---|---|
| 5,316,640 A | 5/1994 | Wakabayashi et al. | |
| 5,324,623 A | 6/1994 | Tsumori | |
| 6,323,920 B1* | 11/2001 | Kim | 349/106 |
| 2002/0022292 A1* | 2/2002 | Barber et al. | 438/52 |
| 2004/0136091 A1* | 7/2004 | Hsu et al. | 359/719 |
| 2004/0146807 A1* | 7/2004 | Lee et al. | 430/311 |

FOREIGN PATENT DOCUMENTS

| | | |
|---|---|---|
| JP | 05-136460 | 6/1993 |
| JP | 07-106237 | 4/1995 |
| JP | 2002350843 A * | 12/2002 |

OTHER PUBLICATIONS

Schilling et al., "Surface profiles of reflow microlenses under the influence of surface tension and gravity," Aug. 2000, Opt. Eng. 39(8) 2000 Society of Photo-Optical Instrumentation Engineers, pp. 2171-2176.*
O'Neill et al., "Photoresist reflow method of microlens production: Modeling and fabrication techniques," Sep. 2004, Photon Management, Proceedings of SPIE vol. 5456, pp. 197-208.*
Wolf et al. "Silicon Processing for the VLSI era vol. 1: Process Technology," 2000, Lattice Press, pp. 673-678.*

* cited by examiner

*Primary Examiner*—Carl Whitehead, Jr.
*Assistant Examiner*—Jennifer M Dolan
(74) *Attorney, Agent, or Firm*—Rabin & Berdo, PC

(57) ABSTRACT

The present invention provides a method for manufacturing a microlens in a semiconductor substrate having a first surface and a second surface, comprising the steps of preparing the semiconductor substrate, forming a first resist layer approximately cylindrical in form on the first surface of the semiconductor substrate, reflowing the first resist layer by heat treatment while holding the semiconductor substrate in such a manner that the first surface is normal to a vertical line and placed below the second surface, thereby to deform the first resist layer into a second resist layer approximately hemispherical in form, and simultaneously etching the second resist layer and the semiconductor substrate by means of anisotropic etching to form the corresponding lens in the semiconductor substrate.

5 Claims, 2 Drawing Sheets

MICROLENS MANUFACTURING METHOD

BACKGROUND OF THE INVENTION

The present invention relates to a method for manufacturing a microlens formed in a semiconductor substrate.

A microlens has been greatly used in optical devices such as an optical communication connector, a CCD (Charge Coupled Device) image pickup element, etc. Since the microlens is small in shape, a manufacturing method such as a reflow method, a gray-scale mask method or the like, which is different from grinding or molding used in the normal lens manufacture, has generally been used. The reflow method will now be explained in brief. First, a resist pattern approximately cylindrical in form is formed on a bedding or base substrate by photolithography. Thereafter, the substrate is heated to fluidize a resist, whereby a resist pattern approximately hemispherical in form is formed by surface tension. Subsequently, such a resist pattern is etched by anisotropic dry etching simultaneously with the base substrate, and the pattern approximately hemispherical in form is transferred onto the base substrate, whereby a microlens is fabricated.

The inventions related to microlens manufacturing methods have been described in, for example, patent documents 1 (Japanese Unexamined Patent Publication No. Hei 5(1993)-136460 (refer to the 4th page and FIG. 2) and 2 (Japanese Unexamined Patent Publication No. Hei 7(1995)-106237) (refer to the fourth page and FIGS. 4 through 7).

According to the microlens manufacturing method described in Japanese Unexamined Patent Publication No. Hei 5(1993)-136460, a resist pattern approximately hemispherical in form, which is formed on a base substrate (GaAs) by potting, is used as an etching mask, and the resist pattern and the base substrate are simultaneously etched to fabricate a microlens (refer to a second embodiment).

According to the microlens manufacturing method described in Japanese Unexamined Patent Publication No. Hei 7(1995)-106237, a plurality of first resist patterns formed on a base substrate in zigzags are deformed into hemispherical form by heat treatment. Thereafter, a plurality of hemispherical second resist patterns are further formed in spaces defined among the thermosetted or heat-cured first resist patterns. Thus, a CCD converging microlens whose lens-to-lens distance has been shortened is fabricated.

In the reflow method, the thickness of the post-reflow resist pattern, i.e., the thickness of its top portion approximately hemispherical in form, and the applied thickness of resist prior to the formation of the pattern by photolithography are placed in a predetermined proportionality relation. The thickness of the post-reflow resist pattern has heretofore been controlled by adjusting the applied thickness of resist.

With miniaturization of a lens and an improvement in its precision, however, a mere adjustment to the applied thickness of resist is becoming difficult to form a resist pattern necessary for desired lens formation. This is because demands contradictory to each other with respect to the resist thickness exist in two processes necessary for manufacture of a microlens, i.e., a photolithography process and a dry etching process respectively. In terms of processing of the resist by photolithography, there is a need to make thin the applied thickness of resist for the purpose of lens miniaturization. This is because optical transmittance is reduced upon exposure when the applied thickness of resist is thick, and a development remainder, so-called scum is apt to occur upon development. On the other hand, there is a need to ensure a predetermined thickness as the thickness of the resist pattern approximately hemispherical in form, which serves as the etching mask, in terms of the formation of the lens pattern by dry etching. It cannot be said that the thinning of the resist is a desirable direction. Thus, there is a need to increase the thickness of the resist pattern approximately hemispherical in form, which serves as the etching mask in the dry etching process, while meeting the demand for thinning of the applied thickness of resist in the photolithography process.

The microlens manufacturing method described in Japanese Unexamined Patent Publication No. Hei 5(1993)-136460 needs not to perform the photolithography-based resist processing necessary for the normal reflow method because the resist pattern approximately hemispherical in form is formed by potting. Therefore, a description about the adjustment to the thickness of the post-reflow resist is not especially shown in Japanese Unexamined Patent Publication No. Hei 5(1993)-136460.

The microlens manufacturing method described in Japanese Unexamined Patent Publication No. Hei 7(1995)-106237 has the fear that since the resist pattern approximately hemispherical in form is formed by the reflow method, a problem about such a resist thickness as already mentioned above arises with the miniaturization of the lens. However, the adjustment to the thickness of the post-reflow resist is not described in Japanese Unexamined Patent Publication No. Hei 7(1995)-106237 in particular.

SUMMARY OF THE INVENTION

With the foregoing in view, it is therefore an object of the present invention to provide a method for manufacturing a microlens, which is capable of increasing the thickness of a post-reflow resist while the applied thickness of resist is being thinned.

According to one aspect of the present invention, for attaining the above object, there is provided a method for manufacturing a microlens formed in a semiconductor substrate having a first surface and a second surface, comprising the steps of preparing the semiconductor substrate, forming a first resist layer approximately cylindrical in form on the first surface of the semiconductor substrate, reflowing the first resist layer by heat treatment while holding the semiconductor substrate in such a manner that the first surface is normal to a vertical line and placed below the second surface, thereby to deform the first resist layer into a second resist layer approximately hemispherical in form, and simultaneously etching the second resist layer and the semiconductor substrate by means of anisotropic etching to form the corresponding lens in the semiconductor substrate.

According to the microlens manufacturing method according to the present invention, when the first resist layer approximately cylindrical in form is reflowed, it is heat-treated with the first and second surfaces of the semiconductor substrate being turned upside down, i.e., the first surface of the semiconductor substrate formed with the first resist layer being directed downward vertically. Consequently, the fluidized second resist layer approximately hemispherical in form is pulled down by gravitation, so that its thickness increases. Thus, a predetermined thickness of the second resist layer that serves as an etching mask can be ensured while the applied thickness of resist is thinned.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

First Preferred Embodiment

FIGS. 1A through 1E are process sectional views showing a method for manufacturing a microlens, according to a first embodiment of the present invention.

Figure 1A:
FIGS. 1A through 1E are production process views of a microlens according to a first embodiment of the present invention.

As shown in FIG. 1A, a semiconductor substrate 101 for fabricating the microlens is first prepared. The semiconductor substrate 101 is a silicon substrate, for example.

Figure 1B:
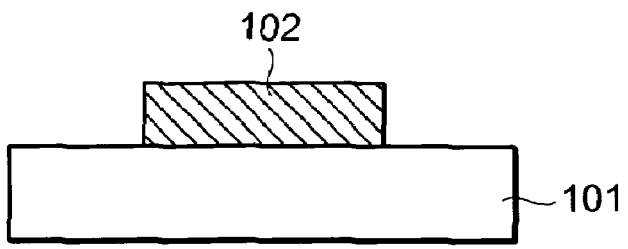

Next, as shown in FIG. 1B, a resist is applied onto the semiconductor substrate 101 to form a resist pattern 102 shaped in the form of a substantially circular cylinder by using the known photolithography. Now, the applied thickness of the resist is suitably set according to the size of a formed lens. When, however, a lens having a diameter having approximately 100 μm, for example is formed, the applied thickness of the resist may be set to approximately 10 to 50 μm.

Figure 1C:
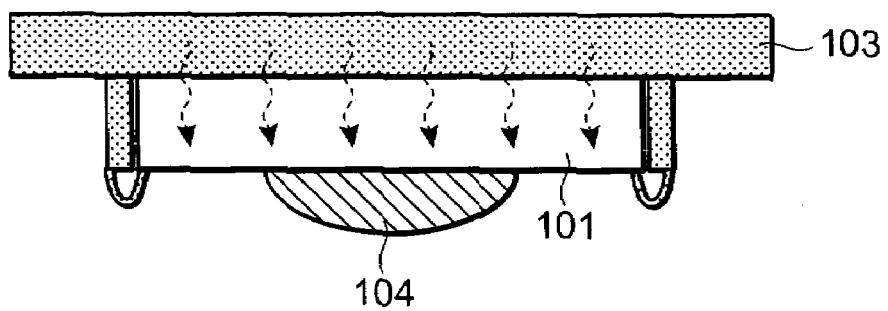

Next, as shown in FIG. 1C, the semiconductor substrate 101 formed with the resist pattern 102 is placed on a hot plate 103 and turned upside down, i.e., so that a surface thereof with the resist pattern 102 formed thereon being directed downward vertically. Then, thermal treatment is effected thereon at a glass transition temperature or higher of the resist. Thus, the resist pattern 102 approximately cylindrical or columnar in form is reflowed to deform into a resist pattern 104 shaped in the form of a substantially hemisphere. Thermal treatment conditions are set to 300 seconds at 160° C. -180° C., for example, and may suitably be set according to resist materials to be used. Since the fluidized resist pattern 104 is pulled down by gravitation in the present thermal treatment process, its thickness can be increased.

Figure 1D:
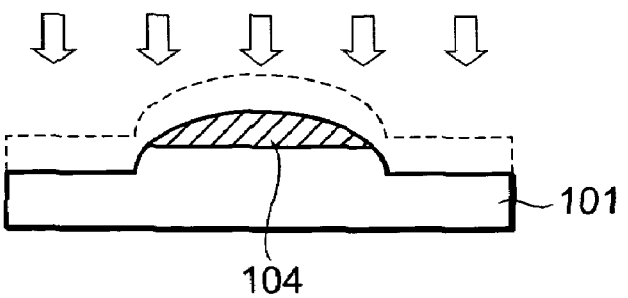

Next, as shown in FIG. 1D, the resist pattern 104 and the semiconductor substrate 101 are simultaneously etched by anisotropic dry etching such as Reactive Ion Etching (RIE). The etching executed here makes use of, for example, a mixed gas of $CF_4$ (tetrafluoromethane) and $O_2$ as an etching gas. If a mixture ratio of $CF_4$ and $O_2$ is adjusted in the present etching process in such a manner that a selective ratio of the resist pattern 104 and the semiconductor substrate 101 reaches approximately 1, then the resist pattern 104 and the semiconductor substrate 101 are etched at approximately equal rates so that the resist pattern 104 approximately hemispherical in form is transferred onto the semiconductor substrate 101.

Figure 1E:
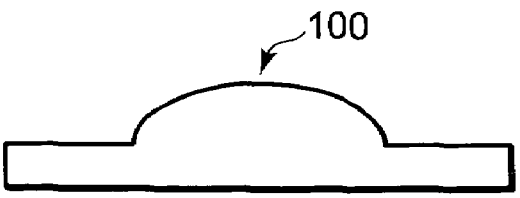

The etching further proceeds and a microlens 100 having substantially the same curvature as the shape of the resist pattern 104 is completed as shown in FIG. 1E in a state in which the resist pattern 104 has perfectly been removed.

Incidentally, the present embodiment is not limited to the manufacture of the microlens. When it is necessary to form a substantially hemispherical pattern similar to the microlens, the present embodiment can also be applied to other semiconductor devices or MEMS (Micro Electro Mechanical Systems) or the like.

According to the microlens manufacturing method according to the first embodiment, when the resist pattern 102 approximately cylindrical in form is reflowed, it is heat-treated by means of the hot plate with the surface formed with the resist pattern 102 being directed downward vertically, so that the fluidized resist pattern 104 approximately hemispherical in form is pulled down by gravitation, thereby leading to an increase in its thickness. Thus, since the predetermined thickness of the resist pattern 104 that serves as an etching mask can be ensured while the applied thickness of resist is being thinned, a fine and high-precision microlens can be fabricated. Since the fine and high-precision microlenses can be manufactured, high integration of a CCD lens array using those is also enabled.

Second Preffered Embodiment

FIGS. 2A through 2E are process sectional views showing a method for manufacturing a microlens, according to a second embodiment of the present invention.

Figure 2A:
FIGS. 2A through 2E are production process views of a microlens according to a second embodiment of the present invention.

As shown in FIG. 2A, a semiconductor substrate 201 for fabricating the microlens is first prepared. The semiconductor substrate 201 is a silicon substrate, for example.

Figure 2B:
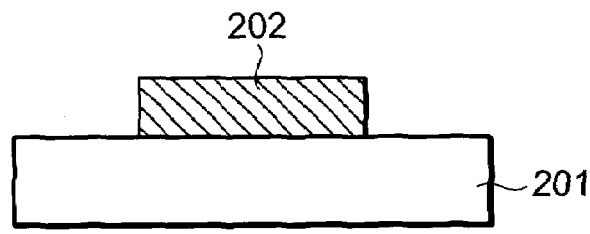

Next, as shown in FIG. 2B, a resist is applied onto the semiconductor substrate 201 to form a resist pattern 202 approximately cylindrical in form by using the known photolithography. Now, the applied thickness of the resist is suitably set according to the size of a formed lens. When, however, a lens having a diameter of approximately 100 μm, for example is formed, the applied thickness of the resist may be set to approximately 10 to 50 μm.

Figure 2C:
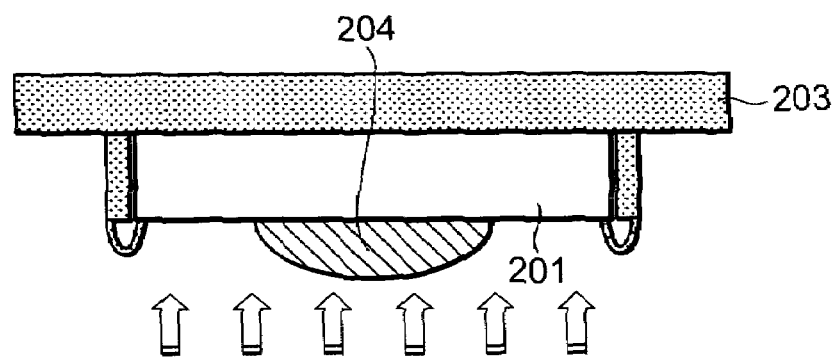

Next, as shown in FIG. 2C, the semiconductor substrate 201 formed with the resist pattern 202 is fixed to a predetermined support device 203 and turned upside down, i.e., so that a surface thereof with the resist pattern 202 formed thereon being directed downward vertically. Then, thermal treatment is effected thereon at a glass transition temperature or higher of the resist by the radiation of energy lines such as infrared rays. Thus, the resist pattern 202 approximately cylindrical in form is reflowed to deform into a resist pattern 204 approximately hemispherical in form. Incidentally, an electron beam is used in place of the use of the infrared rays as the energy lines for heat treatment. Since the fluidized resist pattern 204 is pulled down by gravitation in the present thermal treatment process, its thickness can be increased.

Figure 2D:
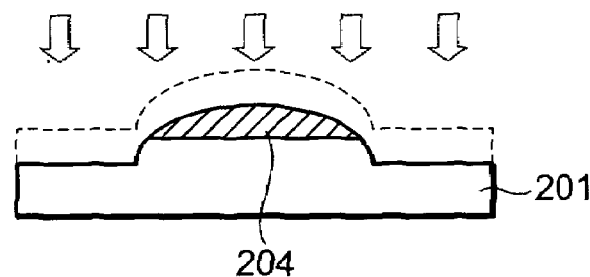

Next, as shown in FIG. 2D, the resist pattern 204 and the semiconductor substrate 201 are simultaneously etched by anisotropic dry etching such as Reactive Ion Etching (RIE). The etching executed here makes use of, for example, a mixed gas of $CF_4$ and $O_2$ as an etching gas. If a mixture ratio of $CF_4$ and $O_2$ is adjusted in the present etching process in such a manner that a selective ratio of the resist pattern 204 and the semiconductor substrate 201 reaches approximately 1, then the resist pattern 204 and the semiconductor substrate 201 are etched at approximately equal rates so that the resist pattern 204 approximately hemispherical in form is transferred onto the semiconductor substrate 201.

Figure 2E:
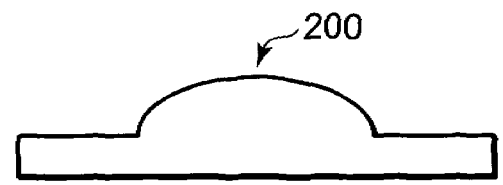

The etching further proceeds and a microlens 200 having substantially the same curvature as the shape of the resist pattern 204 is completed as shown in FIG. 2E in a state in which the resist pattern 204 has perfectly been removed.

Incidentally, the present embodiment is not limited to the manufacture of the microlens. When it is necessary to form an approximately hemispherical pattern similar to the microlens, the present embodiment can also be applied to other semiconductor devices or MEMS or the like.

The microlens manufacturing method according to the second embodiment can bring about an advantageous effect similar to that of the microlens manufacturing method according to the first embodiment. That is, when the resist pattern 202 approximately cylindrical in form is reflowed, heat treatment is effected thereon by radiation of the energy lines such as the infrared rays with the surface formed with the resist pattern 202 being directed downward vertically, so that the fluidized resist pattern 204 approximately hemispherical in form is pulled down by gravitation, thereby leading to an increase in its thickness. Thus, since the predetermined thickness of the resist pattern 204 that serves as an etching mask can be ensured while the applied thickness of resist is being thinned, a fine and high-precision microlens can be fabricated. Since the fine and high-precision microlenses can be manufactured, high integration of a CCD lens array using those is also enabled.

While the preferred forms of the present invention have been described, it is to be understood that modifications will be apparent to those skilled in the art without departing from the spirit of the invention. The scope of the invention is to be determined solely by the following claims.

What is claimed is:

1. A method for manufacturing a microlens formed from a semiconductor substrate having a first surface and a second surface, comprising:

preparing the semiconductor substrate;

forming a first resist layer approximately cylindrical in form on the first surface of the semiconductor substrate;

reflowing the first resist layer using a heat treatment, which is performed by the radiation of energy lines, while holding the semiconductor substrate in such a manner that the first surface is normal to a vertical line and placed below the second surface, to thereby deform the first resist layer into a second resist layer approximately hemispherical in form; and simultaneously etching the second resist layer and the semiconductor substrate by anisotropic etching to form the lens from the semiconductor substrate.

2. The method according to claim 1, wherein the energy lines are infrared rays or an electron beam.

3. The method according to claim 1, wherein the semiconductor substrate is silicon.

4. The method according to claim 3, wherein the anisotropic etching is reactive ion etching (RIE).

5. The method according to claim 4, wherein the reactive ion etching (RIE) makes use of a mixed gas of $CF_4$ (tetrafluoromethane) and $O_2$.

* * * * *